(12) United States Patent
Tajalli

(10) Patent No.: US 10,003,454 B2
(45) Date of Patent: Jun. 19, 2018

(54) SAMPLER WITH LOW INPUT KICKBACK

(71) Applicant: KANDOU LABS, S.A., Lausanne (CH)

(72) Inventor: Armin Tajalli, Chavannes près Renens (CH)

(73) Assignee: KANDOU LABS, S.A., Lausanne (CH)

( * ) Notice: Subject to any disclaimer, the term of this patent is extended or adjusted under 35 U.S.C. 154(b) by 0 days. days.

(21) Appl. No.: 15/494,436

(22) Filed: Apr. 21, 2017

(65) Prior Publication Data

US 2017/0310455 A1    Oct. 26, 2017

Related U.S. Application Data

(60) Provisional application No. 62/326,596, filed on Apr. 22, 2016.

(51) Int. Cl.
| | |
|---|---|
| H03F 3/45 | (2006.01) |
| H04L 7/00 | (2006.01) |
| H03L 7/08 | (2006.01) |
| H04L 7/033 | (2006.01) |

(52) U.S. Cl.
CPC .......... *H04L 7/0087* (2013.01); *H03L 7/0807* (2013.01); *H04L 7/0045* (2013.01); *H04L 7/0331* (2013.01)

(58) Field of Classification Search
CPC ... H04L 7/0087; H04L 7/0331; H04L 7/0045; H03L 7/0087
See application file for complete search history.

(56) References Cited

U.S. PATENT DOCUMENTS

| | | |
|---|---|---|
| 668,687 A | 2/1901 | Mayer |
| 780,883 A | 1/1905 | Hinchman |
| 3,196,351 A | 7/1965 | Slepian |

(Continued)

FOREIGN PATENT DOCUMENTS

| | | |
|---|---|---|
| CN | 1864346 | 11/2006 |
| CN | 101478286 | 7/2009 |

(Continued)

OTHER PUBLICATIONS

"Introduction to: Analog Computers and the DSPACE System," Course Material ECE 5230 Spring 2008, Utah State University, www.coursehero.com, 12 pages.

(Continued)

*Primary Examiner* — Dac Ha
(74) *Attorney, Agent, or Firm* — Invention Mine, LLC

(57) ABSTRACT

Methods and systems are described for receiving a signal to be sampled and responsively generating, at a pair of common nodes, a differential current representative of the received signal, receiving a plurality of sampling interval signals, each sampling interval signal received at a corresponding sampling phase of a plurality of sampling phases, for each sampling phase, pre-charging a corresponding pair of output nodes using a pre-charging FET pair receiving the sampling interval signal, forming a differential output voltage by discharging the corresponding pair of output nodes via a discharging FET pair connected to the pair of common nodes, the FET pair receiving the sampling interval signal and selectively enabling the differential current to discharge the corresponding pair of output nodes, and latching the differential output voltage.

20 Claims, 9 Drawing Sheets

(56) References Cited

U.S. PATENT DOCUMENTS

| | | |
|---|---|---|
| 3,636,463 A | 1/1972 | Ongkiehong |
| 3,939,468 A | 2/1976 | Mastin |
| 4,163,258 A | 7/1979 | Ebihara |
| 4,181,967 A | 1/1980 | Nash |
| 4,206,316 A | 6/1980 | Burnsweig |
| 4,276,543 A | 6/1981 | Miller |
| 4,486,739 A | 12/1984 | Franaszek |
| 4,499,550 A | 2/1985 | Ray, III |
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,017,924 A | 5/1991 | Guiberteau |
| 5,040,060 A | 8/1991 | Owada et al. |
| 5,053,974 A | 10/1991 | Penz |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,510,736 A | 4/1996 | Van De Plassche |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss |
| 5,626,651 A | 5/1997 | Dullien |
| 5,629,651 A | 5/1997 | Mizuno |
| 5,659,353 A | 8/1997 | Kostreski |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,982,954 A | 11/1999 | Delen |
| 5,995,016 A | 11/1999 | Perino |
| 5,999,016 A | 12/1999 | McClintock |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,316,987 B1 | 11/2001 | Daily |
| 6,346,907 B1 | 2/2002 | Dacy |
| 6,359,931 B1 | 3/2002 | Perino |
| 6,378,073 B1 | 4/2002 | Davis |
| 6,384,758 B1 | 5/2002 | Michalski |
| 6,398,359 B1 | 6/2002 | Silverbrook |
| 6,404,820 B1 | 6/2002 | Postal |
| 6,417,737 B1 | 7/2002 | Moloudi |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,690,739 B1 | 2/2004 | Mui |
| 6,766,342 B2 | 7/2004 | Kechriotis |
| 6,772,351 B1 | 8/2004 | Werner |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,700 B1 | 8/2005 | Klehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,951 B2 | 1/2006 | Dhong |
| 6,990,138 B2 | 1/2006 | Bejjani |
| 6,991,038 B2 | 1/2006 | Guesnon |
| 6,993,311 B2 | 1/2006 | Li |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,075,996 B2 | 7/2006 | Simon |
| 7,080,280 B2 | 7/2006 | Yamamoto |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,176,823 B2 | 2/2007 | Zabroda |
| 7,180,949 B2 | 2/2007 | Kleveland |
| 7,184,483 B2 | 2/2007 | Rajan |
| 7,199,728 B2 | 4/2007 | Daily |
| 7,231,558 B2 | 6/2007 | Gentieu |
| 7,269,130 B2 | 9/2007 | Pitio |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,539,532 B2 | 5/2009 | Tran |
| 7,636,057 B2 | 5/2009 | Ozawa |
| 7,599,390 B2 | 10/2009 | Pamarti |
| 7,613,234 B2 | 11/2009 | Raghavan |
| 7,616,075 B2 | 11/2009 | Kushiyama |
| 7,620,116 B2 | 11/2009 | Bessios |
| 7,633,850 B2 | 12/2009 | Nagarajan |
| 7,639,596 B2 | 12/2009 | Cioffi |
| 7,643,588 B2 | 1/2010 | Visalli |
| 7,650,525 B1 | 1/2010 | Chang |
| 7,656,321 B2 | 2/2010 | Wang |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |

(56) References Cited

U.S. PATENT DOCUMENTS

| | | |
|---|---|---|
| 7,706,524 B2 | 4/2010 | Zerbe |
| 7,746,764 B2 | 6/2010 | Rawlins |
| 7,768,312 B2 | 8/2010 | Hirose |
| 7,787,572 B2 | 8/2010 | Scharf |
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,279,745 B2 | 10/2012 | Dent |
| 8,289,914 B2 | 10/2012 | Li |
| 8,295,250 B2 | 10/2012 | Gorokhov |
| 8,295,336 B2 | 10/2012 | Lutz |
| 8,305,247 B2 | 11/2012 | Pun |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,801 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,649,556 B2 | 2/2014 | Wedge |
| 8,649,840 B2 | 2/2014 | Sheppard, Jr. |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,755,426 B1 | 6/2014 | Cronie |
| 8,773,964 B2 | 7/2014 | Hsueri |
| 8,780,687 B2 | 7/2014 | Clausen |
| 8,782,578 B2 | 7/2014 | Tell |
| 8,831,440 B2 | 9/2014 | Yu |
| 8,841,936 B2 | 9/2014 | Nakamura |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,162,405 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,479,369 B1 | 10/2016 | Shokrollahi |
| 9,509,437 B2 | 11/2016 | Shokrollahi |
| 9,544,015 B2 | 1/2017 | Ulrich |
| 9,634,797 B2 | 4/2017 | Benammar |
| 9,667,379 B2 | 5/2017 | Cronie |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0016763 A1 | 1/2003 | Doi |
| 2003/0016770 A1 | 1/2003 | Trans |
| 2003/0046618 A1 | 3/2003 | Collins |
| 2003/0085763 A1 | 5/2003 | Schrodinger |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1* | 11/2003 | Mulder ............ H03K 17/04106 341/158 |
| 2004/0027185 A1 | 2/2004 | Fiedler |
| 2004/0146117 A1 | 7/2004 | Subramaniam |
| 2004/0155802 A1 | 8/2004 | Lamy |

(56) References Cited

U.S. PATENT DOCUMENTS

| | | |
|---|---|---|
| 2004/0161019 A1 | 8/2004 | Raghavan |
| 2004/0169529 A1 | 9/2004 | Afghahi |
| 2005/0063493 A1 | 3/2005 | Foster |
| 2005/0134380 A1 | 6/2005 | Nairn |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |
| 2005/0220182 A1 | 10/2005 | Kuwata |
| 2005/0270098 A1 | 12/2005 | Zhang |
| 2006/0036668 A1* | 2/2006 | Jaussi ............... G06G 7/16 708/819 |
| 2006/0097786 A1 | 5/2006 | Su |
| 2006/0103463 A1 | 5/2006 | Lee |
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0233291 A1 | 10/2006 | Garlepp |
| 2007/0001723 A1 | 1/2007 | Lin |
| 2007/0002954 A1 | 1/2007 | Cornelius |
| 2007/0030796 A1 | 2/2007 | Green |
| 2007/0103338 A1 | 5/2007 | Teo |
| 2007/0121716 A1 | 5/2007 | Nagarajan |
| 2007/0182487 A1 | 8/2007 | Ozasa |
| 2007/0201546 A1 | 8/2007 | Lee |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0192621 A1 | 8/2008 | Suehiro |
| 2008/0317188 A1 | 12/2008 | Staszewski |
| 2009/0059782 A1 | 3/2009 | Cole |
| 2009/0115523 A1* | 5/2009 | Akizuki ............ H03F 3/45183 330/260 |
| 2009/0154604 A1 | 6/2009 | Lee |
| 2009/0195281 A1 | 8/2009 | Tamura |
| 2009/0262876 A1 | 10/2009 | Arima |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0235673 A1 | 9/2010 | Abbasfar |
| 2010/0271107 A1 | 10/2010 | Tran |
| 2010/0283894 A1 | 11/2010 | Horan |
| 2010/0296666 A1 | 11/2010 | Rave |
| 2010/0309964 A1 | 12/2010 | Oh |
| 2011/0014865 A1 | 1/2011 | Seo |
| 2011/0028089 A1 | 2/2011 | Komori |
| 2011/0032977 A1 | 2/2011 | Hsiao |
| 2011/0051854 A1 | 3/2011 | Kizer |
| 2011/0072330 A1 | 3/2011 | Kolze |
| 2011/0074488 A1 | 3/2011 | Broyde |
| 2011/0084737 A1 | 4/2011 | Oh |
| 2011/0103508 A1 | 5/2011 | Mu |
| 2011/0127990 A1 | 6/2011 | Wilson |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0317559 A1 | 12/2011 | Kern |
| 2012/0082203 A1 | 4/2012 | Zerbe |
| 2012/0133438 A1 | 5/2012 | Tsuchi |
| 2012/0152901 A1 | 6/2012 | Nagorny |
| 2012/0161945 A1 | 6/2012 | Single |
| 2012/0213299 A1 | 8/2012 | Cronie |
| 2012/0257683 A1 | 10/2012 | Schwager |
| 2013/0010892 A1 | 1/2013 | Cronie |
| 2013/0013870 A1 | 1/2013 | Cronie |
| 2013/0106513 A1 | 5/2013 | Cyrusian |
| 2013/0114519 A1 | 5/2013 | Gaal |
| 2013/0114663 A1 | 5/2013 | Ding |
| 2013/0129019 A1 | 5/2013 | Sorrells |
| 2013/0147553 A1 | 6/2013 | Iwamoto |
| 2013/0188656 A1 | 7/2013 | Ferraiolo |
| 2013/0195155 A1 | 8/2013 | Pan |
| 2013/0202065 A1 | 8/2013 | Chmelar |
| 2013/0215954 A1 | 8/2013 | Beukema |
| 2013/0259113 A1 | 10/2013 | Kumar |
| 2013/0271194 A1 | 10/2013 | Pellerano |
| 2013/0307614 A1 | 11/2013 | Dai |
| 2013/0314142 A1 | 11/2013 | Tamura |
| 2013/0315501 A1 | 11/2013 | Atanassov |
| 2013/0346830 A1 | 12/2013 | Ordentlich |
| 2014/0159769 A1 | 6/2014 | Hong |
| 2014/0177645 A1 | 6/2014 | Cronie |
| 2014/0177696 A1 | 6/2014 | Hwang |
| 2014/0266440 A1 | 9/2014 | Itagaki |
| 2014/0269130 A1 | 9/2014 | Maeng |
| 2015/0049798 A1 | 2/2015 | Hossein |
| 2015/0070201 A1* | 3/2015 | Dedic ............... H03M 1/0624 341/144 |
| 2015/0078479 A1 | 3/2015 | Whitby-Strevens |
| 2015/0222458 A1 | 8/2015 | Hormati |
| 2015/0249559 A1 | 9/2015 | Shokrollahi |
| 2015/0333940 A1 | 11/2015 | Shokrollahi |
| 2015/0349835 A1 | 12/2015 | Fox |
| 2015/0380087 A1 | 12/2015 | Mittelholzer |
| 2015/0381232 A1 | 12/2015 | Ulrich |
| 2016/0020796 A1 | 1/2016 | Hormati |
| 2016/0020824 A1 | 1/2016 | Ulrich |
| 2016/0036616 A1 | 2/2016 | Holden |
| 2016/0146771 A1 | 5/2016 | Li |
| 2016/0197747 A1 | 7/2016 | Ulrich |
| 2016/0261435 A1 | 9/2016 | Musah |
| 2017/0310456 A1 | 10/2017 | Tajalli |
| 2017/0317449 A1 | 11/2017 | Shokrollahi |
| 2017/0317855 A1 | 11/2017 | Shokrollahi |

FOREIGN PATENT DOCUMENTS

| | | |
|---|---|---|
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Abbasfar, A., "Generalized Differential Vector Signaling", IEEE International Conference on Communications, ICC '09, (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices Computational Products 6, Reprinted from Electronic Design, May 2, 1985, 7 pages.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

(56) References Cited

OTHER PUBLICATIONS

Design Brief 208 Using the Anadigm Multiplier CAM, Copyright 2002 Anadigm, 6 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Grahame, J., "Vintage Analog Computer Kits," posted on Aug. 25, 2006 in Classic Computing, 2 pages, http://www.retrothing.com/2006/08/classic_analog_.html.
Healey, A., et al., "A Comparison of 25 Gbps NRZ & PAM-4 Modulation used in Legacy & Premium Backplane Channels", DesignCon 2012, 16 pages.
International Search Report and Written Opinion for PCT/EP2011/059279 dated Sep. 22, 2011.
International Search Report and Written Opinion for PCT/EP2011/074219 dated Jul. 4, 2012.
International Search Report and Written Opinion for PCT/EP2012/052767 dated May 11, 2012.
International Search Report and Written Opinion for PCT/US14/052986 dated Nov. 24, 2014.
International Search Report and Written Opinion from PCT/US2014/034220 dated Aug. 21, 2014.
International Search Report and Written Opinion of the International Searching Authority, dated Jul. 14, 2011 in International Patent Application S.N. PCT/EP2011/002170, 10 pages.
International Search Report and Written Opinion of the International Searching Authority, dated Nov. 5, 2012, in International Patent Application S.N. PCT/EP2012/052767, 7 pages.
International Search Report for PCT/US2014/053563, dated Nov. 11, 2014, 2 pages.
Jiang, A., et al., "Rank Modulation for Flash Memories", IEEE Transactions of Information Theory, Jun. 2006, vol. 55, No. 6, pp. 2659-2673.
Loh, M., et al., "A 3x9 Gb/s Shared, All-Digital CDR for High-Speed, High-Density I/O", Matthew Loh, IEEE Journal of Solid-State Circuits, Vo. 47, No. 3, Mar. 2012.
Notification of Transmittal of International Search Report and the Written Opinion of the International Searching Authority, for PCT/US2015/018363, dated Jun. 18, 2015, 13 pages.
Notification of Transmittal of the International Search Report and the Written Opinion of the International Searching Authority, or the Declaration for PCT/EP2013/002681, dated Feb. 25, 2014, 15 pages.
Notification of Transmittal of the International Search Report and The Written Opinion of the International Searching Authority, or The Declaration, dated Mar. 3, 2015, for PCT/US2014/066893, 9 pages.
Notification of Transmittal of The International Search Report and The Written Opinion of the International Searching Authority, or the Declaration, for PCT/US2014/015840, dated May 20, 2014. 11 pages.
Notification of Transmittal of The International Search Report and The Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and The Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Poulton, et al., "Multiwire Differential Signaling", UNC-CH Department of Computer Science Version 1.1, Aug. 6, 2003.
Schneider, J., et al., "ELEC301 Project: Building an Analog Computer," Dec. 19, 1999, 8 pages, http://www.clear.rice.edu/elec301/Projects99/anlgcomp/.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar. 2008, Revista de Matematica: Teoria y Aplicationes, pp. 109-129.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Wang et al., "Applying CDMA Technique to Network-on-Chip", IEEE Transactions on Very Large Scale (VLSI) Integration Systems, vol. 15, No. 10 (Oct. 1, 2007), pp. 1091-1100.
Zouhair Ben-Neticha et al, "The 'streTched"-Golay and other codes for high-SNR fnite-delay quantization of the Gaussian source at 1/2 Bit per sample, IEEE Transactions on Communications, vol. 38, No. 12 Dec. 1, 1990, pp. 2089-2093, XP000203339, ISSN: 0090-6678, DOI: 10.1109/26.64647.
Notification of Transmittal of the International Search Report and the Written Opinion of the International Searching Authority, or the Declaration, dated Feb. 15, 2017, 10 pages.
Notification of Transmittal of the International Search Report and the Written Opinion of the International Searching Authority or the Declaration., for PCT/US17/14997, dated Apr. 7, 2017.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.
Giovaneli, et al., "Space-frequency coded OFDM system for multi-wire power line communications", Power Line Ommunications and Its Applications, 20015 International Symposium on Vancouver, BC, Canada, Apr. 6-8, 2005, Piscataway, NJ, pp. 191-195.

* cited by examiner

SAMPLER WITH LOW INPUT KICKBACK

CROSS REFERENCE TO RELATED APPLICATIONS

This application claims the benefit of U.S. Provisional Application No. 62/326,596, filed Apr. 22, 2016, entitled "SAMPLER WITH LOW INPUT KICKBACK", naming Armin Tajalli, reference of which is hereby incorporated in its entirety for all purposes.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/542,599, filed Jul. 5, 2012, naming Armin Tajalli, Harm Cronie, and Amin Shokrollhi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Commuications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

FIELD OF THE INVENTION

The present embodiments relate to communications systems circuits generally, and more particularly to obtaining an instantaneous measurement of a received signal voltage relative to a provided clock signal, as one component of detecting received communications signals from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device is sampled (or their signal value otherwise recorded) at intervals best representing the original transmitted values, regardless of transmission channel delays, interference, and noise. The timing of this sampling or slicing operation is controlled by an associated Clock and Data Recovery (CDR) timing system, which determines the appropriate sample timing.

BRIEF DESCRIPTION

To reliably detect the data values transmitted over a communications system, a receiver accurately measures the received signal value amplitudes at carefully selected times. In some embodiments, the value of the received signal is first captured at the selected time using a known sample-and-hold or track-and-hold circuit (or known variants such as amplify-and-hold or integrate-and-hold), and then the resulting value is measured against one or more reference values using a known voltage comparator circuit. Other embodiments first use a comparator to "slice" the analog signal and obtain a digital result, then digitally sample the resulting binary value using a clocked digital latch. Further embodiments utilize circuits configured to apply both the time- and amplitude-domain constraints, producing a result that represents the input value at a particular time and relative to a provided reference level.

In many embodiments, a received signal source may be measured by multiple sampling circuits, either to facilitate data reception at rates greater than a single data processing system can sustain (so-called multiphase receiver architectures), or to support ancillary functions such as clock synchronization, test/diagnostic support, etc. In these embodiments, energy leakage such as from clock switching within one sampler may appear as transients at the sampler input (herein described as "kickback"), which may then perturb other sampler measurements of the common input signal. Sampler embodiments are described which produce extremely low levels of kickback energy, making them particularly desirable in such applications.

Methods and systems are described for receiving a signal to be sampled and responsively generating, at a pair of common nodes, a differential current representative of the received signal, receiving a plurality of sampling interval signals, each sampling interval signal received at a corresponding sampling phase of a plurality of sampling phases, for each sampling phase, pre-charging a corresponding pair of output nodes using a pre-charging field-effect transistor (FET) pair receiving the sampling interval signal, forming a differential output voltage by discharging the corresponding pair of output nodes via a discharging FET pair connected to the pair of common nodes, the FET pair receiving the sampling interval signal and selectively enabling the differential current to discharge the corresponding pair of output nodes, and latching the differential output voltage.

DETAILED DESCRIPTION

Figure 1:
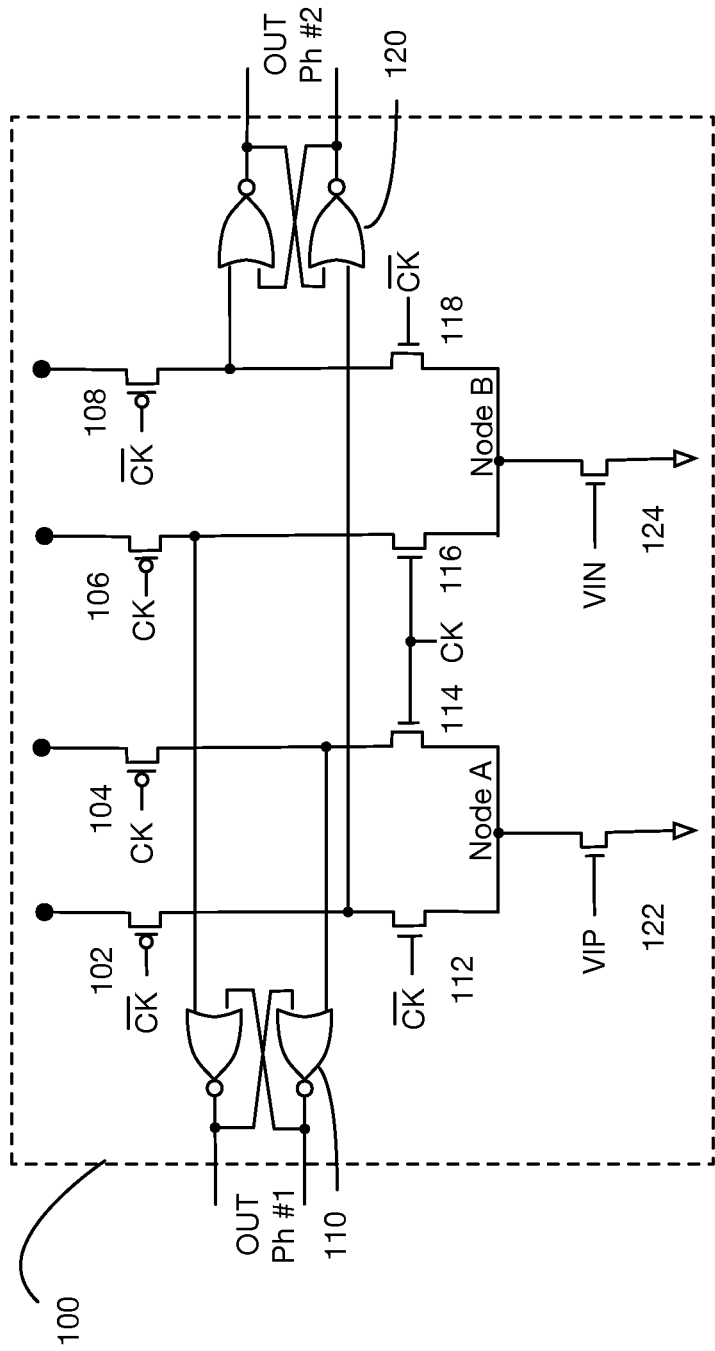
FIG. 1 is a schematic diagram of a clocked voltage sampler embodiment.

To reliably detect the data values transmitted over a communications system, a communications receiver accurately measures its received signal value amplitudes at carefully selected times, typically at or near the center of that received signal's period of stability between transitions. This point is commonly described as the "center of eye", (referring to the well-known "eye diagram" of signal amplitude vs. clock intervals) and is typically determined by use of a local "receive clock" which is configured to occur at that desirable sampling time. Generation and ongoing control of such receive clock timing is well understood in the art, as Clock Data Alignment (CDA) systems measure and incrementally adjust sample timing versus receive signal stability time to optimize sample timing.

In some embodiments, the value of the received signal is first captured at the selected time using a sample-and-hold or track-and-hold circuit, and then the resulting value is measured against one or more reference values using a known voltage comparator circuit. In alternative embodiments, the signal amplitude is continuously measured using a voltage comparator, with the digital result then sampled in time using a clocked digital latch.

Other embodiments utilize circuits capable of applying both the time- and amplitude-domain constraints, producing a result that represents the input value at a particular time and relative to a provided reference level.

In particular, vector signaling codes of the type described in [Cronie I], [Cronie II], and [Shokrollahi II] may be efficiently decoded using so-called Multi-Input Comparators (MICs) as described in [Holden I] and [Tajalli I]. In one embodiment, each MIC performs an analog computation of the form $$\text{sign}(a_0 * x_0 + \ldots + a_{m-1} * x_{m-1}),$$ Eqn. 1 where $(x_0, x_1, x_{m-1})$ are the received vector signaling code values, and $a_0, a_1, \ldots, a_{m-1}$ are "weighting factors" associated with each input, and the sign function is defined as:

$$\text{sign}(x) = +1 \text{ if } x>0, \text{sign}(x) = -1 \text{ if } x<0, \text{ and sign}(x) \text{ is undefined if } x=0.$$

[Holden I] also teaches that Eqn. 1 may be efficiently embodied in a differential amplifier structure having multiple positive and multiple negative inputs, each such input structure representing one element of Eqn. 1. [Ulrich I] further teaches that the weighting factors in such input structures may be efficiently represented as scaled transistor dimensions in an integrated circuit embodiment, or alternatively as paralleled multiple transistor instances where the set of weighting factors may be represented as integer values.

In vector signaling code receivers, each subchannel is composed of a MIC performing the mixing or weighted summation operations for decoding a subchannel, sampling of the resulting output, followed by implementation-specific data processing. At high data rates, four or more phases of data processing may be implemented to keep up with the received symbol rate of the decoders, with each phase typically utilizing its own sampler.

Thus, a single received signal source may be measured by multiple sampling circuits, either to facilitate data reception at rates greater than a single data processing system can sustain, or to support ancillary functions such as clock synchronization, test/diagnostic support, etc. In these embodiments, energy leakage such as from clock switching within one sampler may appear as transients at the sampler input (herein described as "kickback"), which may then perturb other sampler measurements of the common input signal. Sampler embodiments are described that produce extremely low levels of kickback energy, making them particularly desirable in such applications.

Low Kickback Sampler

In many embodiments, a received signal source may be measured by multiple sampling circuits, either to facilitate data reception at rates greater than a single data processing system can sustain (so-called multiphase receiver architectures), or to support ancillary functions such as clock synchronization, test/diagnostic support, etc. In such embodiments, energy leakage such as from clock switching within one sampler may appear as transients at the sampler input (herein described as "kickback"), which may then perturb other sampler measurements of the common input signal. Sampler embodiments are described below that produce extremely low levels of kickback energy, making them particularly desirable in such applications.

FIG. 1 is a schematic diagram for a clocked sampler embodiment presenting extremely low kickback energy to its inputs. When CK is low, the center two discharging field-effect transistors (FETs) 114, 116 are off, and the two pre-charging PMOS FETs 104, 106 are turned on to charge the parasitic capacitance of 114 and 116 at the output nodes (drain terminals). With both of the output nodes charged, the inputs to the OR-gate latch 110 are both high voltages representing logic 1's, thereby causing both outputs of OUT Ph #1 to be lower voltage logic 0's. VIP (Vin+) and VIN (Vin−) are applied to tail current sources 122 124, respectively. Once CK goes high, the PMOS pre-charging FETs 104, 106 are turned off and the NMOS discharging FETs 114 116 are turned on. Depending on the polarity of Vin, VIP will be high or VIN will be high. Whichever one is high will cause either FET 122 or FET 124 to conduct current thereby discharging the respective output node of either FET 114 (if VIP is high) or FET 116 (if VIN is high). As the respective output node transitions to a logic 0, the corresponding NOR gate of latch 110 will transition to a logic 1. As an example, if VIP is high, FET 122 conducts current and discharges the drain output node of discharging FET 114, causing both inputs to the bottom NOR gate of latch 110 to be 0, causing its output to toggle to a 1, which also locks the top NOR gate of latch 110 to have a logic 0 output. Similarly, the FETs 112, 118, 102, 108 operate in the same way with latch 120, but with the timing associated with clock phase CK. Further, the PMOS/NMOS configurations described above should not be considered limiting, and may be reversed in some embodiments.

Sampler 100 is inherently two-phased, controlled by complementary clocks CK and (CK)⁻, sampling differential signal inputs VIP and VIN and producing digital results OUTPh#1 and OUTPh#2. The circuit symmetry causes potential clock-related noise injection to be cancelled out, or to appear as less troublesome common-mode input disturbances. Because Node A and Node B are at virtual ground level and thus experience little voltage swing, they are relatively immune to noise induced via parasitic paths from the sampler output or clock inputs. As Nodes A and B experience a small amount of voltage swing due to the isolation from the output nodes, the amount of input kickback that is introduced into input signals VIP and VIN is reduced. Further, the Miller capacitance of the transistors associated with VIP and VIN inputs is extremely low and constant, further reducing input kickback.

One of inputs VIP and VIN may alternatively be used as a reference voltage input and the other as a single-ended received signal input.

Figure 5:
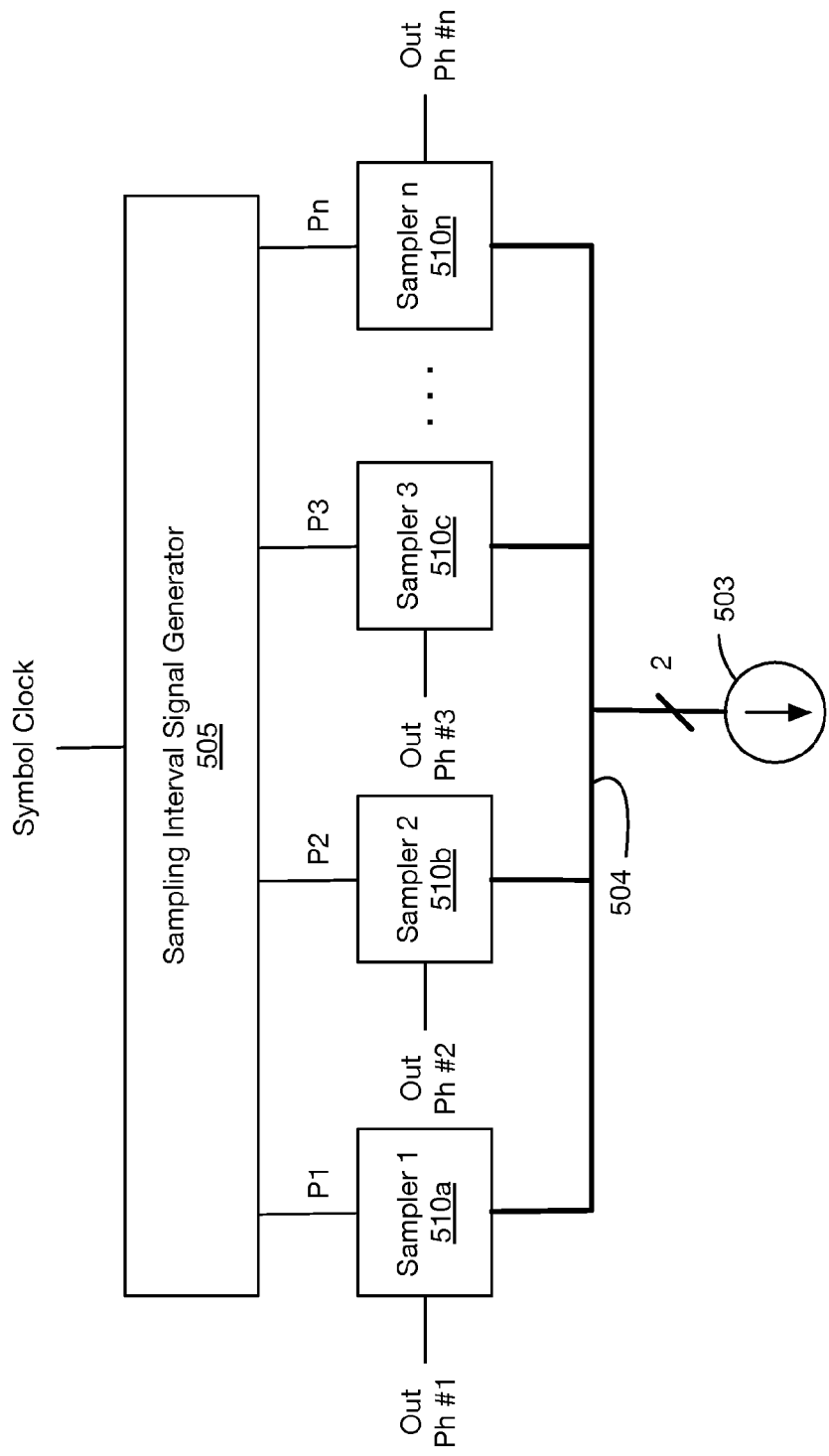
FIG. 5 is a block diagram of a multi-phase sampler with low input kickback, in accordance with some embodiments.

FIG. 5 illustrates a multi-phase sampler with low input kickback, in accordance with some embodiments. As shown, the multi-phase sampler includes a differential current generator 503 configured to receive a signal to be sampled, and to responsively generate, at a pair of common nodes 504, a differential current representative of the received signal. The apparatus further includes a sampling interval signal generator 505 configured to receive a symbol clock and to responsively generate the sampling interval signals P1, P2, . . . Pn on a plurality of sampling interval phase outputs. The apparatus further includes a plurality of samplers 510a/510b/ . . . /510n, each sampler connected to the pair of common nodes 504. In some embodiments, each sampler includes a pre-charging FET pair having a control input connected to one of the plurality of sampling interval phase outputs to pre-charge a pair of output nodes. Further, each sampler may include a FET pair, each FET of the FET pair connected to a corresponding common node of the pair of common nodes, the FET pair having a control input connected to one of the plurality of sampling interval phase outputs and configured to selectively enable the differential current to discharge the pair of output nodes, forming a differential output voltage. The sampler further includes a latch connected to the output nodes of the FET pair, the latch configured to latch the differential output voltage to form outputs Out Ph#1, etc.

Referring to the example given in FIG. 1, it may be observed the schematic of FIG. 1 includes 2 samplers. The first sampler includes pre-charging FET pair 104/106 connected to sampling interval signal CK, and includes discharging FET pair 114/116 connected to sampling interval signal CK to discharge the output nodes connected to latch 110 using differential current generator composed of current sources 122 and 124 receiving the signal to be sampled VIN/VIP. Similarly, FIG. 1 includes a second sampler receiving sampling interval signal CK, the second sampler composed of pre-charging FET pair 102/108, FET pair 112/118, and latch 120.

Figure 4:
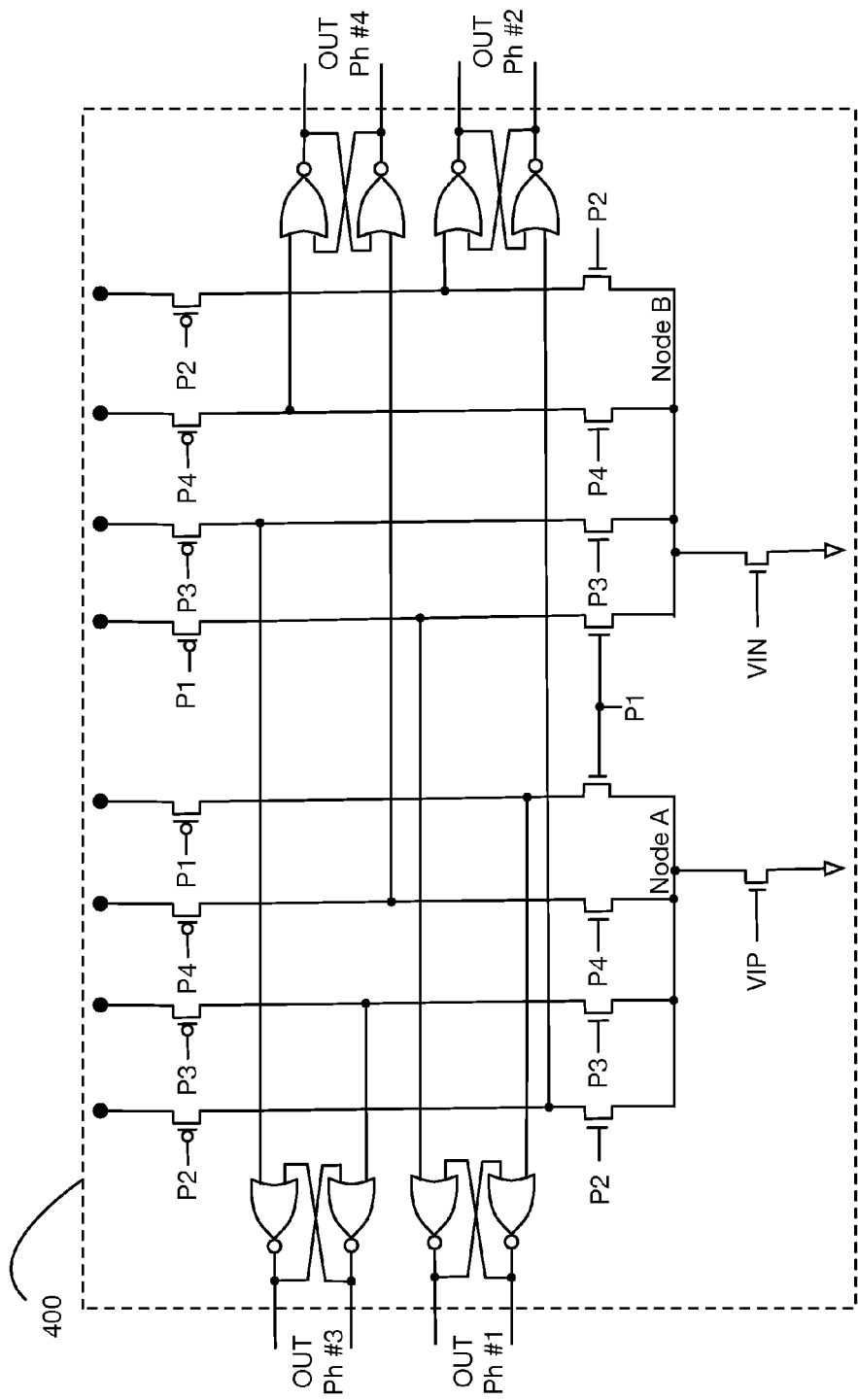
FIG. 4 is a schematic diagram of another clocked voltage sampler embodiment.

The described architecture may be extended to support additional sampling phases within the same sampling circuit. FIG. 4 is a schematic diagram of another embodiment, in which the two phase transistor elements of 100 connecting to Node A and Node B in FIG. 1 are replicated. In the resulting four phase clocked sampler embodiment 400, clock phases P1, P2, P3, and P4 are four non-overlapping clock phases, each controlling the sample timing for respective differential outputs OUT Ph#1, OUT Ph#2, OUT Ph#3, OUT Ph#4. Other numbers of sampling phases may be supported by similarly replicating the appropriate number of transistor structures as illustrated by these examples.

Figure 6A:
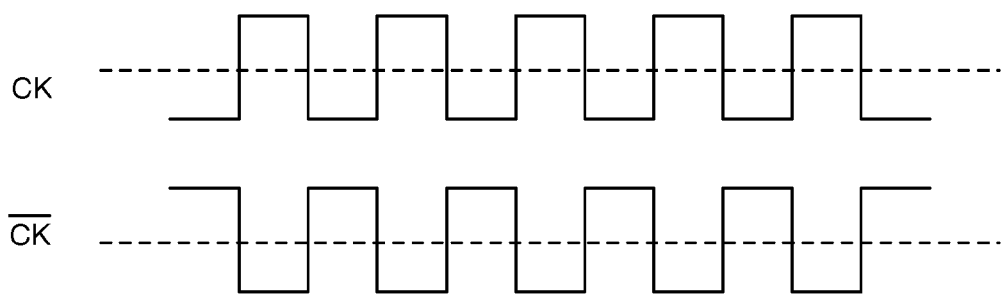
FIGS. 6A and 6B are timing diagrams depicting sampling interval signals, in accordance with some embodiments.
Figure 6B:
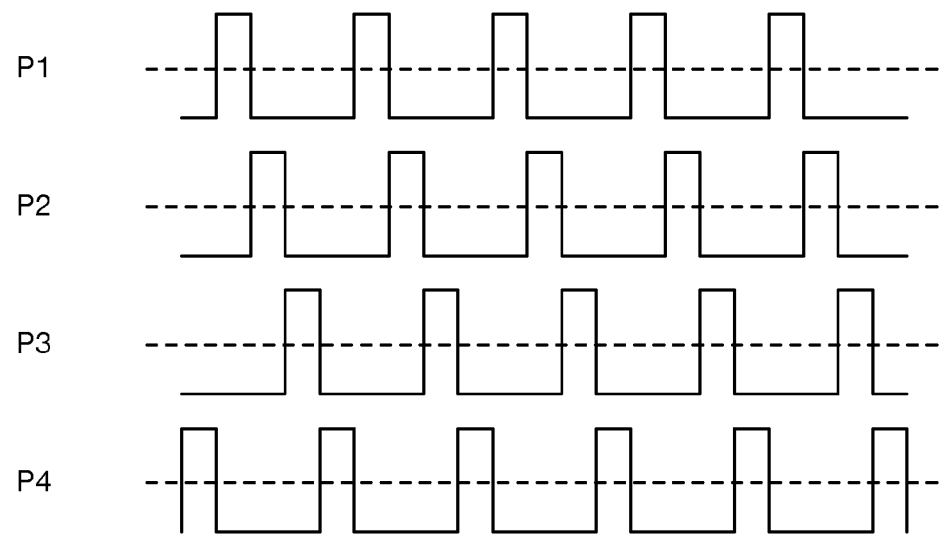

FIGS. 6A and 6B illustrate timing diagrams for sampling interval signals, in accordance with some embodiments. As shown, FIG. 6A illustrates sampling interval signals CK and $\overline{CK}$, in accordance with FIG. 1. As shown, sampling interval signals CK and $\overline{CK}$ are clock signals having a 50% duty cycle and a 180-degree phase difference, and are non-overlapping. FIG. 6B illustrates a set of four sampling interval signals P1/P2/P3/P4 in accordance with FIG. 4. As shown, each sampling interval signal P1/P2/P3/P4 has a duty cycle of 25% and are thus non overlapping. In some embodiments, for a given number of phases n, a duty cycle of each sampling interval may be 1/n·100%. In some embodiments, the sampling interval signal generator may operate on a received symbol clock, which may be received on separate wires of the multi-wire bus, embedded in a sub-channel in orthogonal encoding embodiments, derived from signal transitions on the multi-wire bus, or various other ways of clock data recovery (CDR). In some embodiments, the symbol clock may be used directly, as in FIG. 6A, while alternative embodiments may generate non-overlapping signals such as the sampling interval signals P1/P2/P3/P4 in FIG. 6B.

Figure 7:
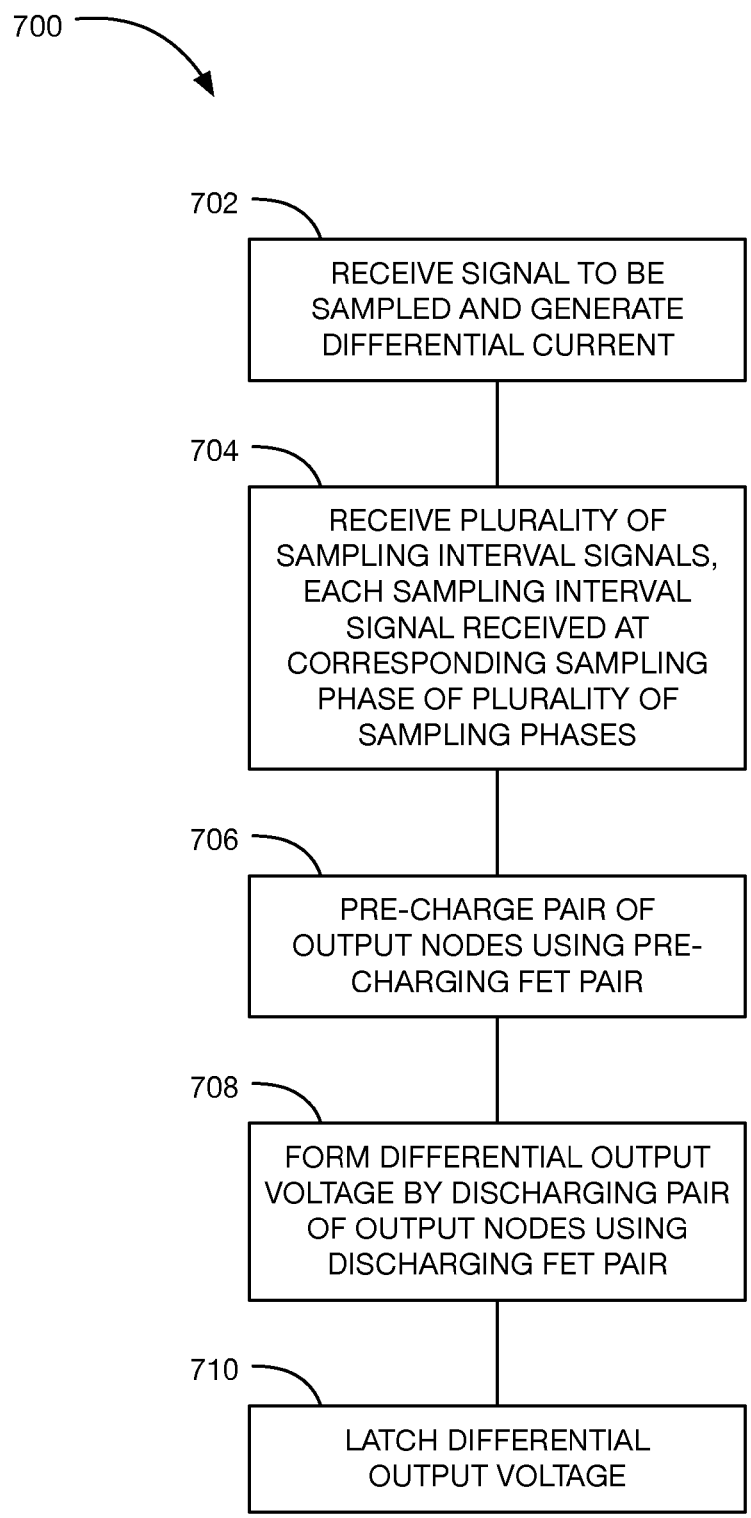
FIG. 7 is a flowchart of a method, in accordance with some embodiments.

FIG. 7 depicts a flowchart of a method 700, in accordance with some embodiments. As shown, method 700 begins at step 702 by receiving a signal to be sampled and responsively generating, at a pair of common nodes, a differential current representative of the received signal. Further, a plurality of sampling interval signals is received 704, each sampling interval signal received at a corresponding sampling phase of a plurality of sampling phases. For example, as shown in FIG. 1, the sampling phase OUT Ph #1 receives sampling interval signal CK, while sampling phase OUT Ph #2 receives sampling interval signal $\overline{CK}$. For each sampling phase, a corresponding pair of output nodes are pre-charged 706 using a pre-charging FET pair receiving the sampling interval signal. In FIG. 1, a pre-charging FET pair may include FETs 104 and 106. A differential output voltage is formed 708 by discharging the corresponding pair of output nodes via a discharging FET pair, such as FET pair 114/116 connected to the pair of common nodes, the FET pair receiving the sampling interval signal and selectively enabling the differential current to discharge the corresponding pair of output nodes. Lastly, the differential output voltage is latched 710, for instance using SR latch 110.

Figure 3A:
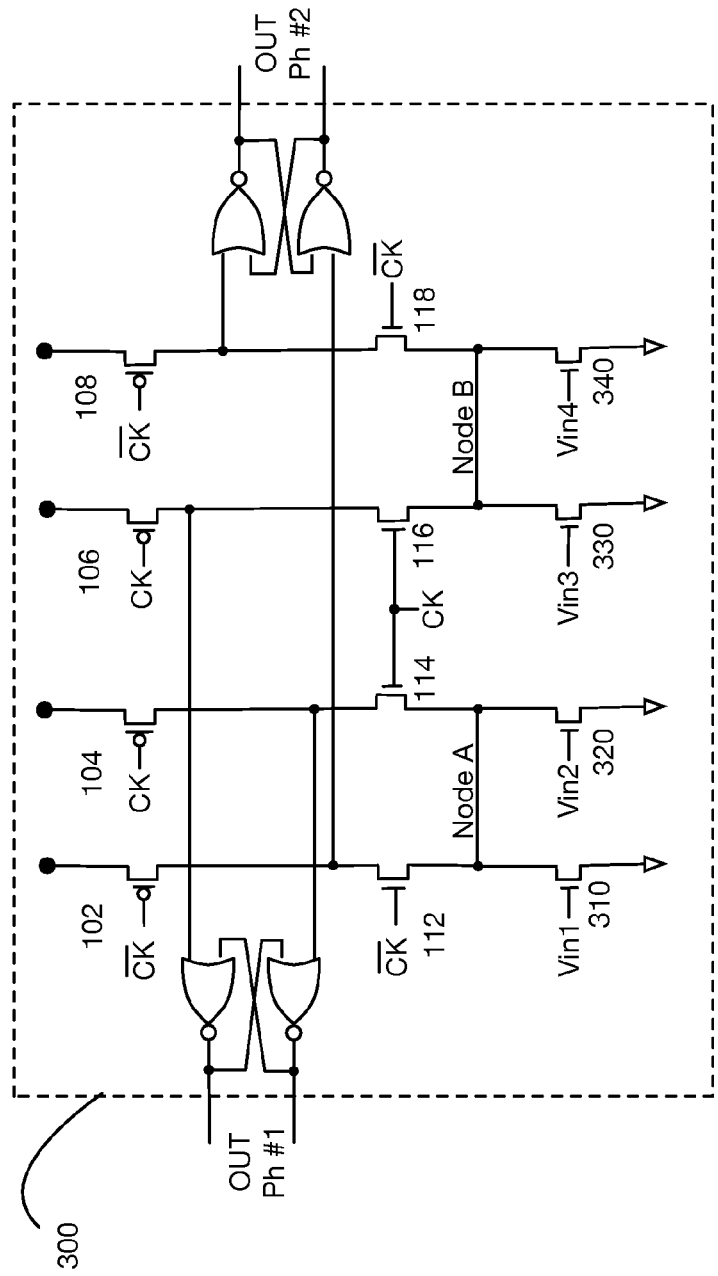
FIGS. 3A, 3B, and 3C are schematic diagrams of a clocked voltage sampler embodiment further comprising linear decoding of a vector signaling code, in accordance with some embodiments.
Figure 3B:
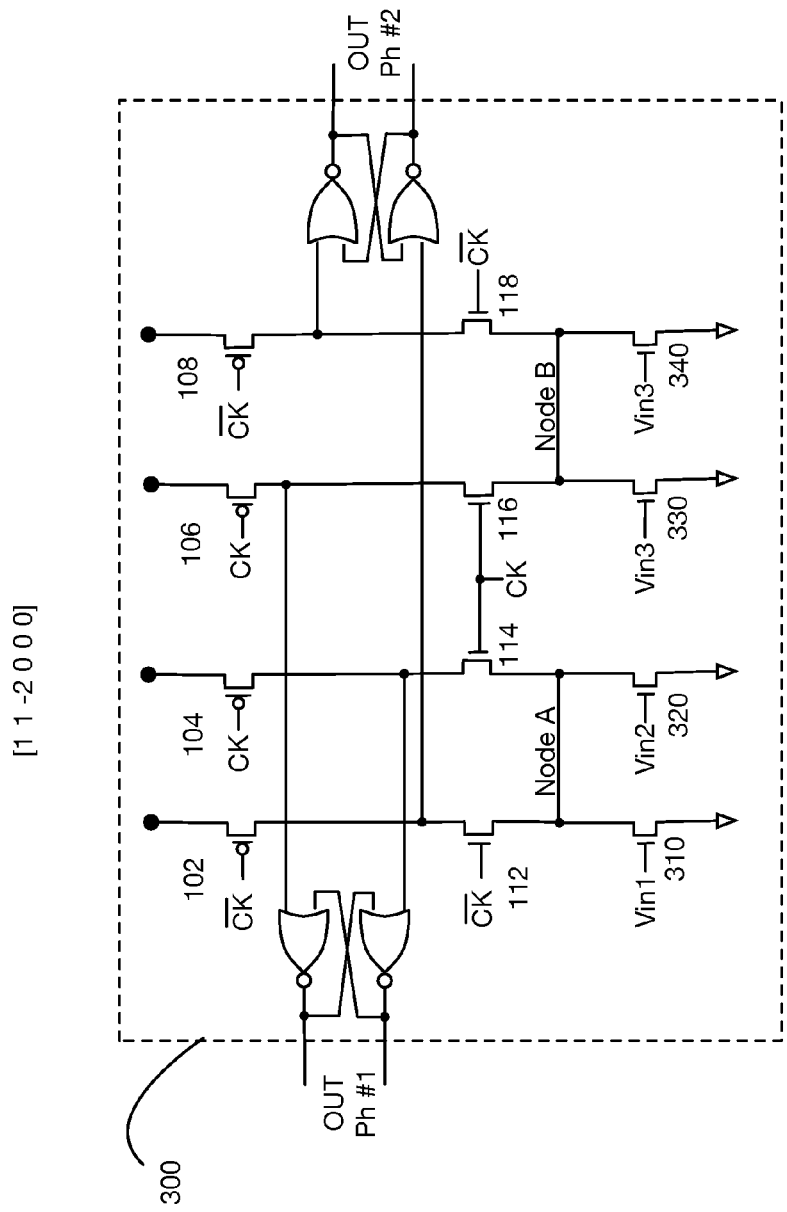
Figure 3C:
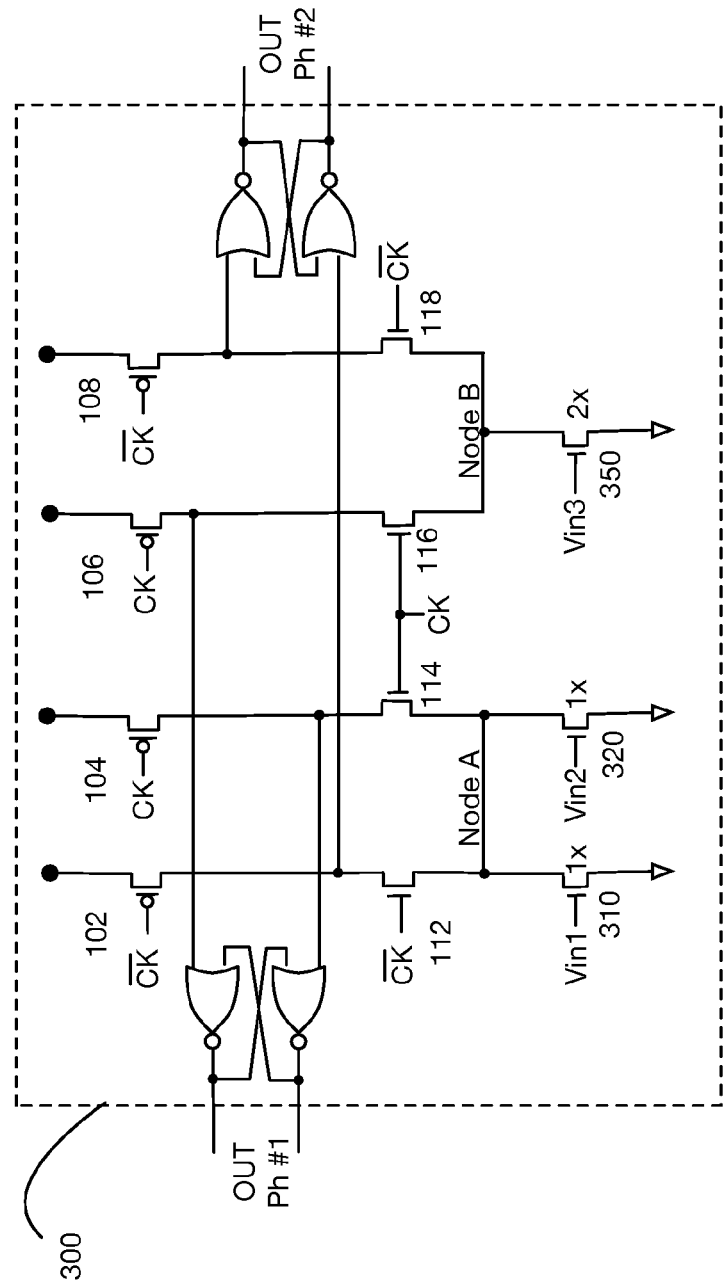

In some embodiments, the received signal to be sampled is a differential input signal, such as VIN/VIP shown in FIG. 1. Alternatively, the received signal to be sampled comprises a plurality of signal components corresponding to symbols of a codeword of a vector signaling code, such as signal components Vin1/Vin2/Vin3/Vin4 shown in FIG. 3A. In some embodiments, generating the differential current comprises forming linear combinations of the signal components of the received signal to be sampled. FIGS. 3A-3C illustrate such circuits for forming linear combinations. Specifically, FIG. 3A illustrates the linear combination of (Vin1+Vin2)−(Vin3+Vin4). In such embodiments, the linear combinations are formed using a plurality of current sources. In some embodiments, the plurality of current sources each have equal magnitude, as shown in FIG. 3A and FIG. 3B. Alternatively, a first current source of the plurality of current sources has a magnitude larger than a second current source of the plurality of current sources. Such an embodiment is illustrated by FIG. 3C, where current source depicted by 350 has a magnitude 2× that of current sources depicted by transistors 310 and 320, each having magnitude 1×.

In some embodiments, the pair of common nodes are virtual ground for isolating the received signal to be sampled from the pair of output nodes.

Figure 2:
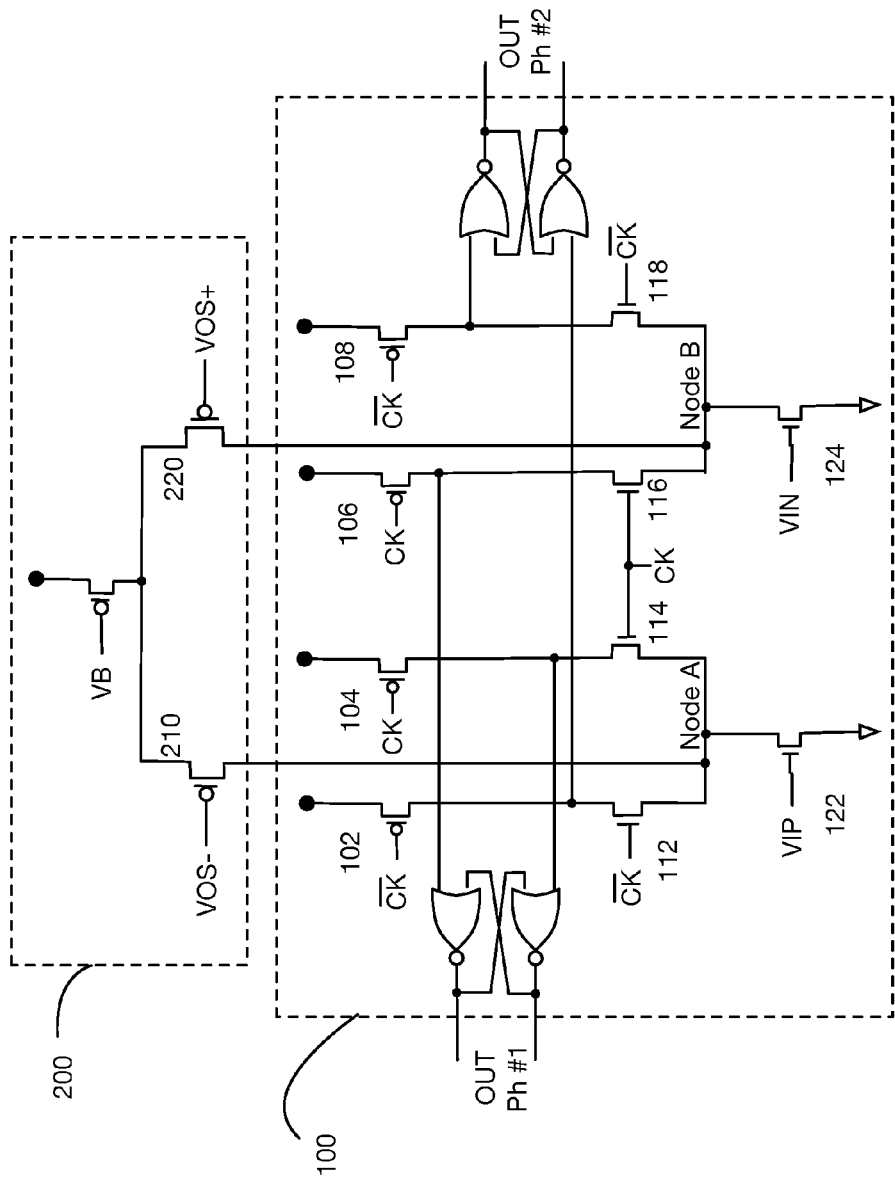
FIG. 2 is a schematic diagram of a clocked voltage sampler embodiment further comprising an offset voltage compensator.

In some embodiments, the method further includes injecting an offset voltage into the pair of common nodes, as shown for example in FIG. 2.

In some embodiments, the plurality of sampling interval signals are non-overlapping, as shown in FIGS. 6A and 6B.

Offset Voltage Compensation

FIG. 2 is a schematic diagram of an embodiment combining the clocked voltage sampler of FIG. 1 with an offset voltage compensation circuit. As shown, offset voltage compensation circuit takes the form of a differential offset FET pair 210/220. Sampler 100 is effectively identical to the circuit of FIG. 1, with offset voltage compensator 200 injecting corrective voltages VOS+ and VOS− into the pair of common nodes of 100 at Node A and Node B. Voltage VB provides bias current for the offset voltage compensator 200, and should be selected such that the PMOS side current does not exceed the NMOS side current within 200. VB also has a secondary control effect on sampler gain, with low PMOS current relative to NMOS current in 200 correlating with low gain in 100, and similar PMOS and NMOS currents in 200 correlating with higher gain in 100.

The use of a single offset voltage correction circuit 200 for a single sampler 100 providing results to two processing phases results in a lower power utilization for the overall sampler system, compared to known art methods requiring one correction circuit per sampler per processing phase.

The corrective voltages may be used to adjust circuit parameters, such as to compensate for circuit imbalance caused by component mismatch or drift. Alternatively, in at least one embodiment the corrective voltages comprise signal measurement thresholds intentionally introduced to control the switching point for sampler output results. In a further embodiment the corrective voltages comprise communications network compensation values, such as produced by a Decision Feedback Compensation (DFE) system.

Combined Linear Decoder and Sampler

The clocked voltage sampler of FIG. 1 may also be combined with the functionality of a Multi-input comparator (MIC) to produce a single circuit that mixes (i.e. decodes) a vector signaling code input and samples the decoded result. FIG. 3A is a schematic diagram of one such embodiment, in which multiple paralleled input transistors 310, 320, 330, 340 accepting signal components of the received signal to be sampled, shown as vector signaling code inputs Vin1, Vin2, Vin3, and Vin4 respectively. A linear combination of the signal components may be formed to form an output. As shown in FIG. 3A, the linear combination is represented by the equation (Vin1+Vin2)−(Vin3+Vin4). Further, additional paralleled transistors may be attached to Node A and/or Node B, either to support additional inputs, or to provide integer ratio weighting functions for particular inputs, as taught in [Holden I], [Ulrich I], and [Tajalli I]. FIG. 3B is a schematic diagram illustrating the use of transistors 330 and 340 both accepting Vin3 to apply a weight of 2 to Vin 3, while Vin1 and Vin2 each have weights of 1. As such, the linear combination performed by the circuit of FIG. 3B is (Vin1+Vin2)−(2·Vin3). In some embodiments, a sum of weights connected to each Node A and Node B is equal, representing a balanced condition. FIG. 3C illustrates a further embodiment utilizing weighting, in which transistors 330 and 340, each having weights of 1, are replaced by a single transistor 350 receiving Vin3 and having a weight of 2. In such embodiments, transistor 350 may have different characteristics than transistors 310 and 320 applying weights of 1 to Vin1 and Vin2, respectively. Such characteristics may include differing transistor width/length, for instance. Similar to FIG. 3B, the circuit depicted by FIG. 3C represents the linear combination of (Vin1+Vin2)−(2·Vin3). In some embodiments, 300 may be combined with 200 of FIG. 2 to inject offset voltage corrections into Node A and Node B, e.g. to support DFE correction.

It should be noted that the term "circuit" may mean, among other things, a single component or a multiplicity of components, which are active and/or passive, and which are coupled together to provide or perform a desired function. The term "circuitry" may mean, among other things, a circuit, a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays.

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The embodiments described are also directed to such representation of the circuitry described herein, and/or techniques implemented thereby, and, as such, are intended to fall within the scope of the present embodiments.

Moreover, the various circuits and circuitry, as well as techniques, disclosed herein may be represented via simulations and simulation instruction-based expressions using computer aided design, simulation and/or testing tools. The simulation of the circuitry described herein, and/or techniques implemented thereby, may be implemented by a computer system wherein characteristics and operations of such circuitry, and techniques implemented thereby, are simulated, imitated, replicated, analyzed and/or predicted via a computer system. Simulations and testing of the devices and/or circuitry described herein, and/or techniques implemented thereby, and, as such, are intended to fall within the scope of the present embodiments. The computer-readable media and data corresponding to such simulations and/or testing tools are also intended to fall within the scope of the present embodiments.

The invention claimed is:

1. An apparatus comprising:
   a differential current generator configured to receive a signal to be sampled and to responsively generate, at a pair of common nodes, a differential current representative of the received signal;
   a sampling interval signal generator configured to receive a symbol clock and to responsively generate a plurality of sampling interval signals on a plurality of sampling interval phase outputs; and,
   a plurality of samplers, each sampler connected to the pair of common nodes, each sampler comprising:
      a pre-charging field-effect transistor (FET) pair having a control input connected to one of the plurality of sampling interval phase outputs to pre-charge a pair of output nodes;
      a discharging FET pair, each FET of the discharging FET pair connected to a corresponding common node of the pair of common nodes, the discharging FET pair having a control input connected to one of the plurality of sampling interval phase outputs to selectively enable the differential current to discharge the pair of output nodes, forming a differential output voltage; and
      a latch connected to the pair of output nodes, the latch configured to latch the differential output voltage.

2. The apparatus of claim 1, wherein the received signal is a differential input signal, and wherein the differential current generator comprises a corresponding current source connected to each common node, each current source receiving a corresponding input signal of the differential input signal.

3. The apparatus of claim 1, wherein the received signal comprises a plurality of signal components representing symbols of a codeword of a vector signaling code.

4. The apparatus of claim 3, wherein the differential current generator comprises a plurality of current sources connected to at least a first node of the pair of common nodes, each current source of the plurality of current sources configured to receive a corresponding signal component of the received signal.

5. The apparatus of claim 4, wherein the plurality of current sources each have an equal current magnitude.

6. The apparatus of claim 4, wherein a first current source of the plurality of current sources has a magnitude larger than a second current source of the plurality of current sources.

7. The apparatus of claim 1, wherein a total magnitude of current sources connected to each common node is balanced.

8. The apparatus of claim 1, wherein the pair of common nodes are virtual ground and configured to isolate the differential current generator from the pair of output nodes.

9. The apparatus of claim 1, further comprising an offset voltage compensation circuit connected to the pair of common nodes configured to inject an offset voltage into the pair of common nodes.

10. The apparatus of claim 1, wherein the sampling interval signals in the plurality of sampling interval signals are non-overlapping.

11. A method comprising:
   receiving a signal to be sampled and responsively generating, at a pair of common nodes, a differential current representative of the received signal;
   receiving a plurality of sampling interval signals, each sampling interval signal received at a corresponding sampling phase of a plurality of sampling phases, for each sampling phase:
      pre-charging a corresponding pair of output nodes using a pre-charging FET pair receiving the sampling interval signal;
      forming a differential output voltage by discharging the corresponding pair of output nodes via a discharging FET pair connected to the pair of common nodes, the FET pair receiving the sampling interval signal and selectively enabling the differential current to discharge the corresponding pair of output nodes; and
      latching the differential output voltage.

12. The method of claim 11, wherein the received signal to be sampled is a differential input signal.

13. The method of claim 11, wherein the received signal to be sampled comprises a plurality of signal components corresponding to symbols of a codeword of a vector signaling code.

14. The method of claim up, wherein generating the differential current comprises forming linear combinations of the signal components of the received signal to be sampled.

15. The method of claim 14, wherein the linear combinations are formed using a plurality of current sources.

16. The method of claim 15, wherein a first current source of the plurality of current sources has a magnitude larger than a second current source of the plurality of current sources.

17. The method of claim 15, wherein the plurality of current sources have equal magnitude.

18. The method of claim 11, wherein the pair of common nodes are virtual ground for isolating the received signal to be sampled from the pair of output nodes.

19. The method of claim 11, further comprising injecting an offset voltage into the pair of common nodes.

20. The method of claim 11, wherein the sampling interval signals in the plurality of sampling interval signals are non-overlapping.

* * * * *